(12) United States Patent
Chen et al.

(10) Patent No.: US 10,522,791 B2
(45) Date of Patent: Dec. 31, 2019

(54) ADVANCED LIGHT EXTRACTION STRUCTURE

(71) Applicant: PIXELLIGENT TECHNOLOGIES LLC, Baltimore, MD (US)

(72) Inventors: Zhiyun Chen, Rockville, MD (US); Gregory D. Cooper, Fulton, MD (US)

(73) Assignee: PIXELLIGENT TECHNOLOGIES, LLC, Baltimore, MD (US)

( * ) Notice: Subject to any disclaimer, the term of this patent is extended or adjusted under 35 U.S.C. 154(b) by 0 days.

(21) Appl. No.: 16/035,494

(22) Filed: Jul. 13, 2018

(65) Prior Publication Data

US 2018/0342703 A1     Nov. 29, 2018

Related U.S. Application Data

(63) Continuation of application No. 14/903,822, filed as application No. PCT/US2014/045671 on Jul. 8, 2014, now Pat. No. 10,050,236, which is a continuation-in-part of application No. 14/120,419, filed on Jul. 8, 2013, now Pat. No. 10,033,014.

(51) Int. Cl.
| | |
|---|---|
| *H01L 35/24* | (2006.01) |
| *H01L 51/52* | (2006.01) |
| *H01L 27/32* | (2006.01) |
| *G02B 3/00* | (2006.01) |

(52) U.S. Cl.
CPC ........ *H01L 51/5275* (2013.01); *G02B 3/0056* (2013.01); *G02B 3/0087* (2013.01); *H01L 27/3211* (2013.01); *H01L 27/3244* (2013.01); *H01L 51/5253* (2013.01)

(58) Field of Classification Search
CPC ................. H01L 27/3211; H01L 27/3244
USPC ............................ 257/57, 59, 72
See application file for complete search history.

(56) References Cited

U.S. PATENT DOCUMENTS

| | | | |
|---|---|---|---|
| 6,833,667 B2 | 12/2004 | Hamano et al. | |
| 7,164,454 B2 | 1/2007 | Numata et al. | |
| 7,800,100 B2 | 9/2010 | Lee et al. | |
| 7,936,412 B2 | 5/2011 | Numata et al. | |
| 8,088,499 B1 | 1/2012 | Wang | |
| 8,279,535 B2 | 10/2012 | Hsu et al. | |
| 8,767,139 B2 | 7/2014 | Namata et al. | |
| 10,033,014 B2 * | 7/2018 | Chen .................. | H01L 51/5275 |
| 10,050,236 B2 * | 8/2018 | Chen .................. | H01L 51/5275 |
| 2002/0084952 A1 | 7/2002 | Morley et al. | |
| 2003/0164679 A1 | 9/2003 | Hamano et al. | |
| 2003/0170493 A1 | 9/2003 | Chen | |

(Continued)

FOREIGN PATENT DOCUMENTS

| | | |
|---|---|---|
| CN | 2001821616 | 9/2004 |
| CN | 1960000 | 5/2007 |

(Continued)

OTHER PUBLICATIONS

U.S. Appl. No. 14/903,822, filed Jan. 2016, Chen et al.

(Continued)

*Primary Examiner* — Samuel A Gebremariam
(74) *Attorney, Agent, or Firm* — Nixon & Vanderhye P.C.

(57) ABSTRACT

This presently disclosed technology relates Organic Light Emitting Diodes (OLEDs), more particularly it relates to OLED display light extraction and nanocomposite formulations that can be used for the light extraction structure.

49 Claims, 9 Drawing Sheets

(56) References Cited

U.S. PATENT DOCUMENTS

| | | |
|---|---|---|
| 2004/0217702 A1 | 11/2004 | Garner |
| 2006/0006795 A1 | 1/2006 | Strip |
| 2006/0105483 A1 | 5/2006 | Leatherdale et al. |
| 2006/0210726 A1 | 9/2006 | Jones et al. |
| 2007/0042174 A1 | 2/2007 | Rao |
| 2008/0079355 A1 | 4/2008 | Smith |
| 2008/0119583 A1 | 5/2008 | Jones |
| 2010/0117503 A1 | 5/2010 | Mizuno et al. |
| 2011/0033135 A1 | 2/2011 | Breck et al. |
| 2011/0080513 A1 | 4/2011 | Hsu et al. |
| 2011/0262093 A1 | 10/2011 | Lamansky |
| 2012/0043678 A1 | 2/2012 | Numata et al. |
| 2012/0099323 A1 | 4/2012 | Thompson |
| 2012/0223873 A1 | 9/2012 | Ohta |
| 2013/0221279 A1 | 8/2013 | Xu et al. |
| 2014/0322549 A1 | 10/2014 | Xu et al. |
| 2015/0203709 A1 | 7/2015 | Cooper et al. |
| 2015/0380688 A1 | 12/2015 | Chen et al. |

FOREIGN PATENT DOCUMENTS

| | | |
|---|---|---|
| CN | 102844904 | 12/2012 |
| JP | 2003-031782 | 1/2003 |
| WO | 2008/026862 | 3/2008 |
| WO | 2015/006276 A1 | 1/2015 |

OTHER PUBLICATIONS

International Search Report for PCT/US2014/045671 dated Nov. 24, 2014, five pages.

Written Opinion of the ISA for PCT/US2014/045671 dated Nov. 24, 2014, seven pages.

Office Action (English translation) dated Jul. 24, 2017 received in CN201480049299.8 (Pixelligent Technologies LLC; Apr. 2016; Advanced Light Extraction Structure).

Office Action dated Mar. 28, 2017 in U.S. Appl. No. 14/591,504 (Cooper et al; High Refractive Index Nanocomposite Layer; filed Jan. 7, 2015).

* cited by examiner

ADVANCED LIGHT EXTRACTION STRUCTURE

This application is a continuation of U.S. application Ser. No. 14/903,822, filed on Jul. 8, 2013 (now U.S. Pat. No. 10,050,236), which in turn is the U.S. national phase of International Application No. PCT/US2014/045671 filed Jul. 8, 2014 which claims benefit of and is a continuation-in-part of U.S. application Ser. No. 14/120,419, filed Jul. 8, 2013 (now U.S. Pat. No. 10,033,014), the entire contents of each application being expressly incorporated hereinto by reference.

This presently disclosed technology relates Organic Light Emitting Diodes (OLEDs), more particularly it relates to OLED display light extraction and nanocomposite formulations that can be used for the light extraction structure.

Light Emitting Devices

Light Emitting Diodes (LEDs) and Organic Light Emitting Diodes (OLEDs) have enjoyed a rapid development in the past couple of decades and have started to replace existing lighting and display devices.

OLED devices are frequently grouped into "bottom emitting" OLEDS, which emit light through a transparent substrate on which the OLED is built, and "top emitting" OLEDs, which emit light away from the substrate on which the OLED is built. Some OLEDs are patterned to form an array of individually addressable pixels (picture elements) or sub-pixels (one of several neighboring emitters of different colors that are grouped together as a pixel but are individually addressable). Such pixelated OLEDs are increasingly popular for use in digital display devices. In contrast to pixelated OLEDs, other OLEDs are designed to have only one emitting area, which may be small and narrow or large and extended depending on the intended application.

Due to the specific device structures of LEDs and OLEDs, significant portion of the light generated inside the active region is totally reflected at various interfaces and is "trapped" inside the device, leads to reduced external efficiency of the light emitting device.

The external efficiency is defined as the power of all optical radiation emitted by the device divided by the total electrical power consumed by the device. External efficiency is an important factor and affects such device characteristics as power consumption, luminance, and lifetime.

The problem is particularly severe for OLED given the technology is in a much earlier development stage than its LED counterpart. For example, only ~20% of all the photons generated in an OLED lighting device are extracted out. Many light extraction schemes have been applied to LEDs and OLEDs, such as backside reflector, high refractive index encapsulant, surface roughening or surface texturing, etc. Textured extraction film is a popular solution for OLED lighting as it is compatible with the roll-to-roll manufacturing process and can be easily applied on either side of the final encapsulation layer.

A pedagogical depiction of the device structure of a typical OLED device with textured surface is shown in FIG. 1. The active area (101) emits light, for both a top emitting and bottom emitting device structure, through a transparent conductor, such as an Indium Tin Oxide (ITO), layer (102) and the substrate (103), which is surface textured (104) to reduce the light loss due to total internal reflection at the substrate/air interface.

In an Active Matrix OLED (AMOLED) display or Passive Matrix OLED (PMOLED), however, due to pixelated nature of the active region, the surface texture degrades the optical quality of the pixels, creating an undesirable blur effect.

In one aspect of the presently disclosed technology, a light extraction structure is described that can be placed immediately on top of, or in close vicinity or proximity, of or to the active region. Such a structure can improve the light extraction of the OLED display and at the same time preserve the optical quality of the pixels.

DETAILED DESCRIPTION

A first exemplary embodiment of a light extraction structure may contain an array of lenses or set of lenses, the array of lenses or sets of lenses contain a high refractive index material having refractive index higher than the encapsulation layer or the substrate, each of the lens or set of lenses is applied between the active region of a light emitting device and the encapsulation layer or substrate layer of the light emitting device, each of the lens or set of lenses covers at least one pixel, a planarization layer between the array of lenses or sets of lenses and the encapsulation or substrate layer, the light extraction structure enhances the overall extraction efficiency of light generated by the active region to the viewer or the external light detector.

A light extraction structure of the present disclosure may include an array of lenses and optionally or additionally a planarization material as described herein.

Figure 2:
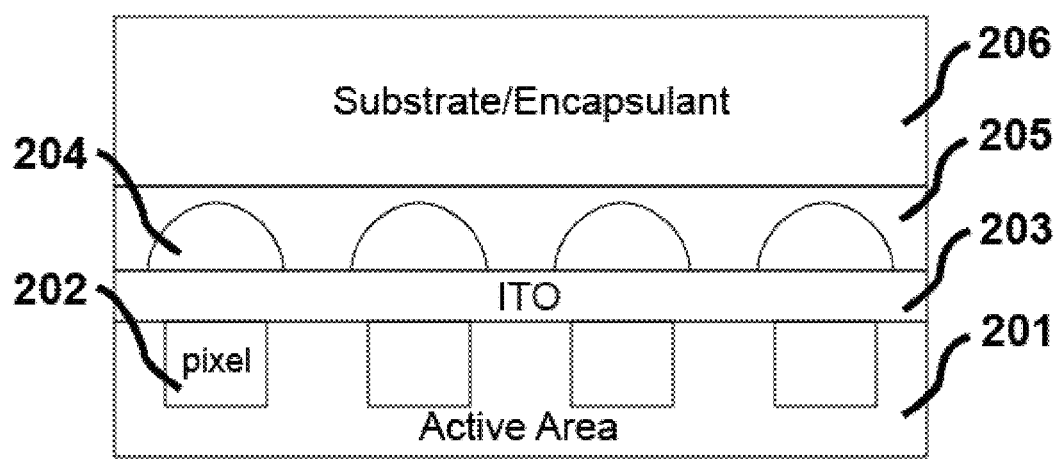
FIG. 2 shows an exemplary OLED device structure of current invention.

An illustrative depiction of an embodiment of the presently disclosed technology is shown in FIG. 2.

The active layer (201) is divided into an array of pixels (202). The light emitted from the pixels may pass through a thin ITO layer (203) and the lenses (204). A planarization layer (205) may be applied to reduce air trapped between the lenses and the substrate, promote better adhesion, and provide refractive index matching. The light transmits out of the substrate (206).

The light emitting device of an exemplary embodiment of a light extraction structure of the presently disclosed technology may contain light emitting diode(s) (LED), organic-light emitting diode(s) (OLED), electro-luminescence device(s), or liquid crystals device(s) (LCD).

Light extraction efficiency may be improved in the presently disclosed technology by incorporation or inclusion of a lens material that is compatible with current process and material system, has a higher refractive index than the substrate or encapsulant, and/or a high optical transparency in the visible spectrum.

Lens and light extraction structures of the presently disclosed technology achieve these requirements by incorporating and/or including nanocrystals and/or nanocomposites as described herein.

According to the presently disclosed technology, when the size of nanocrystals (such as inorganic nanocrystals) described and/or included in the lens and/or light extraction structure(s) of the presently disclosed technology is smaller than one tenth of the wavelength of the light, the scattering by the nanocrystals is negligible. Therefore, high refractive index, high transparency nanocomposites of the present disclosure can be achieved by dispersing inorganic nanocrystals with high refractive index into polymeric materials with relatively lower refractive index, while at the same time meeting the processability requirements of many manufacturing process involving lighting structures where the presently disclosed lens and/or light extraction structures may be incorporated.

One example of such a high refractive index nanocomposite is disclosed in U.S. Provisional Patent Application No. 61/790,156, filed Mar. 15, 2013 and U.S. patent application Ser. No. 12/211,971, filed Mar. 14, 2014, the entire contents of each of which are incorporated herein in their entirety by reference. In this material system, mono-dispersed sub-10 nm $ZrO_2$ nanocrystals with surface capping agents are dispersed in acrylic monomers, that can be further cured with UV-light to form a high refractive index coating.

The high refractive index material of a light extraction structure of the presently disclosed technology may contain a nanocomposite or formulation, that contains inorganic nanocrystals and a polymeric matrix.

The nanocomposite or formulation may contain curing agent(s) and/or photo-initiator(s), and may be UV curable. Additionally or alternatively, the nanocomposite of formulation may contain curing agent(s) and may be thermally curable.

The nanocomposite or formulation may additionally contain a plasticizer, and/or toughener, and/or thickener, and/or thinner, and/or surfactant, and/or flexibilizer, and/or anti-color agent, and/or other functional additive(s).

Nanocrystals of nanocomposite(s) or formulation(s) of the presently disclosed technology may contain $ZrO_2$, $TiO_2$, ZnO, MgO, $HfO_2$, $Nb_2O_5$, $Ta_2O_5$, and/or $Y_2O_3$. These inorganic materials possess both high refractive index and transparency at visible spectrum.

The nanocrystals of nanocomposite(s) or formulation(s) of the presently disclosed technology may have size smaller than 10 nm in at least one dimension.

The nanocrystals of nanocomposite(s) or formulation(s) of the presently disclosed technology optionally include specific functional group(s), such as capping agent(s) or capping group(s). These specific functional group(s) have been grafted to the surface of the nanocrystals of the presently disclosed technology. Such nanocrystals are described herein as well as in U.S. Pat. No. 8,592,511 (Williams et al), the entire content of which is incorporated in its entirety herein by reference.

Exemplified capping agent(s) demonstrated in the present disclosure include 2-[2-(2-9-methoxyethoxy) ethoxy]acetic acid and/or methoxy(triethyleneoxy) propyltrimethoxysilane and/or 3-methacryloyloxypropyltrimethoxysilane and/or n-octyl trimethoxysilane and/or dodecyltrimethoxysilane and/or m,p-ethylphenethyl trimethoxysilane.

Capping of nanocrystals may require a solvent exchange as as-synthesized nanocrystals may be surface modified in a solvent other than the solvent of nanocrystals synthesis. Solvent exchange may be accomplished by, for example, decanting reaction liquor and rinsing the nanocrystals with the capping solvent, which may then be used as a washing or rinsing solvent that is itself decanted to produce a wet cake of uncapped nanocrystals.

For example to perform the surface modification of the nanocrystals with 2-[2-(2-9-methoxyethoxy) ethoxy]acetic acid, the nanocrystals may be suspended in the capping solvent, for example, toluene for 2-[2-(2-9-methoxyethoxy) ethoxy]acetic acid modification, alternatively at a loading of 10 wt % or greater, alternatively 20 wt % or greater, alternatively 30 wt % or greater, calculated based on the weight of the wet nanocrystal cake. While the suspension is being stirred, the capping agent may be added slowly. The amount of capping agent used may be 8-60 wt % to the weight of the wet nanocrystal cake. The suspension may be allowed to stir at 20-27° C. for 10-30 minutes and then refluxed at the boiling point of the capping solvent for 30-60 minutes. After refluxing, the clear solution is cooled to 50-60° C. slowly. This suspension may then be filtered to remove dust and aggregates larger than 200 nm. The capped nanocrystals may then be precipitated out from the capping solvent using heptane. The precipitated nanocrystals may then be collected by centrifugation. The nanocrystals thus collected may then be dispersed in tetrahydrofuran (THF) and again re-precipitated using heptane. This process may be repeated twice. The wet cake of nanocrystals collected in the final step may then be dried under vacuum.

The presently disclosed nanocomposite(s) or formulation(s) may also be made as a solvent free formulation or as a formulation or material with a low or reduced solvent content. Such low or no solvent materials are desirable both because of environmental and health purposes and because of processing constraints and/or limitations when solvents are present.

Inorganic nanocrystals of the present disclosure are, for example, mono-dispersible, with an average size range of 3-7 nm, and containing a surface treatment that aids in dispersion of the nanocrystals in a large variety of solvents and polymers. The presently disclosed material advantageously does not require the inclusion of solvents and the nanocrystals of the present disclosure are dispersible in the polymer and/or monomer material of the present disclosure, without the inclusion of solvents or additional dispersing agents. These nanocrystals, which have been surface modified with capping agents, possess greater compatibility with monomers and/or oligomers and/or polymers without reduction in processability. The surface modified nanocrystals of the present application may be formulated in a resin mixture that is transparent and has a viscosity that allows spin coating of, for example, 3-4 micron thick films. The films obtained from the nanocomposite(s) or formulation(s) of the present disclosure additionally demonstrate high refractive index, high optical transmittance in the visible spectrum, and are thermally stable at temperatures above 120° C., or above 175° C., or above 200° C.

The films or light extraction structure(s) including the nanocomposite(s) or formulation(s) according to the present disclosure possess a high refractive index of 1.6 and higher at 400 nm, or 1.7 and higher at 400 nm, or 1.8 and higher at 400 nm, or 1.9 at 400 nm. The refractive index of the films according to the present disclosure may range from 1.6 to 1.9 at 400 nm.

The films or light extraction structure(s) including the nanocomposite(s) or formulation(s) of the present disclosure additionally or alternatively possess high optical (440-800 nm) transmittance of 80% or 82%, or 86%, or 88%, or 90%, or 92%, or 94%, or 96%, or 98%, and above for films that are less than 5 microns thick. The films of the present disclosure therefore possess a high optical (440-800 nm) transmittance in the range of 80% to 98% and above for films that are less than 5 microns thick.

The transmittance of a film according to the present disclosure may be measured with a Perkin-Elmer UV-Vis Lambda spectrophotometer, wherein the film is coated on a fused silica substrate and another blank fused silica of the same quality and thickness is used as a reference. FIG. 4a, FIG. 4b, FIG. 5a, FIG. 5b, FIG. 6a, and FIG. 6b are examples of the absorbance and transmission results of these films. The ripples shown in these curves are the results of interference of the incoming light and the reflected light at the film/substrate interface.

An exemplary non-limiting embodiment of a formulation of the present disclosure comprises or contains a mixture of acrylic monomers and/or oligomers, and capped or surface treated zirconium oxide nanocrystals. The loading or amount of the nanocrystals included in a formulation of the present disclosure is in the range of 50 wt % to 90 wt % based on the weight of the entire formulation, such as a loading of 50 wt % or greater, or 55 wt % or greater, or 60 wt % or greater, or 65 wt % or greater, or 70 wt % or greater, or 75 wt % or greater, or 80 wt % or greater, or 90 wt %.

The polymer matrix may comprise or contain acrylic monomers, such as benzyl methacrylate (BMA) and trimethylolpropane triacrylate (TMPTA), that optionally included or combined or mixed in a mass ratio in the range of 75:25 to 65:35 wherein the BMA may be present in a relative range of 65-75 and the TMPTA may be present in a relative range of 25-35.

The physical properties of TMPTA, such as viscosity, low volatility and refractive index, make the material uniquely advantageous in a material or composition or film or coating of the present disclosure. TMPTA is less viscous, for example, than hexamethylene diacrylate (HMDA) and bisphenol A diglycerolate dimethacrylate but more viscous than divinylbenzene (DVB). Of the two, TMPTA and HMDA, TMPTA has the higher refractive index (RI=1.474 and 1.456 for TMPTA and HMDA respectively).

BMA is unique in the composition, material and film of the present disclosure in that the monomer has a high refractive index (for an monomer or polymer) of 1.512. The refractive index of BMA therefore helps increase the final refractive index of the film.

Dispersing nanocrystals in BMA alone or with the aid of a solvent such as propylene glycol methyl ether acetate (PGMEA) resulted in films that are difficult to cure by UV or were cracked upon heating at 120° C. and above.

Another multifunctional acrylic monomer, such as TMPTA, HMDA, DVB or bisphenol A diglycerate dimethacrylate (Bisphenol A) may be added as a potential additive to increase the viscosity of the formulation. Films from HMDA-BMA, DVB-BMA and Bisphenol A-BMA combinations were found however to be too brittle in formulations containing nanocrystals of the present disclosure such that these films of these combinations cracked when heated at 120° C. or above.

Additionally, TMPTA and HMDA have refractive indexes<1.49; such that including these monomers reduces the refractive index of the final formulation and film product when compared with BMA.

As described herein, the specific combinations of BMA, TMPTA and nanocrystals of the present disclosure, in the ratios and amounts described herein, provide unexpected advantages in a combination of physical properties, including but not limited to refractive index, light transmittance, temperature resistance and viscosity.

A mass ratio of BMA to TMPTA in the range of 75:25 to 65:35 as described herein has also been discovered to provide unique and unexpected advantages, i.e. high refractive index, high transmittance, and high temperature resistance, in the formulations or compositions of films of the present disclosure. While materials and/or films containing mass ratios of BMA to TMPTA ranging from 95:5 to 80:20 (i.e., 95:5, 90:10 and 80:20) with nanocrystal loading of 80 wt % and above were stable at temperatures below 120 C, as shown in Table 1 below. Nanocrystals of the present disclosure dispersed in TMPTA, without BMA, provided a lower refractive index material than with BMA. Films produced from a mass ratio of BMA to TMPTA according to the presently disclosed technology demonstrated enhanced film quality with, for example, reduced surface roughness and thicker films due, at least in part, to higher viscosity.

TABLE 1

Film results of capped $ZrO_2$ nanocrystals in monomer mixture. 'Good' indicates that the film does not yellow or crack when heated at those indicated temperatures. 'Cracked' indicates that the film cracked during thermal baking. Disadvantage of this formulation is that it comprises of PGMEA to aid in the solubility.

| Monomer mix | Content of $ZrO_2$ to monomer | Capping agent | Post baked at 120 C./60/air | Post baked at 175 C./60/$N_2$ | Post baked at 200 C./$N_2$/60 min |
|---|---|---|---|---|---|
| 2-10 wt % Bisphenol A diglycerolate dimethacrylate in | 50-80 wt % | 2-[2-(2-9-methoxyethoxy) ethoxy]acetic acid | good | cracked | |

TABLE 1-continued

Film results of capped ZrO$_2$ nanocrystals in monomer mixture. 'Good' indicates that the film does not yellow or crack when heated at those indicated temperatures. 'Cracked' indicates that the film cracked during thermal baking. Disadvantage of this formulation is that it comprises of PGMEA to aid in the solubility.

| Monomer mix | Content of ZrO$_2$ to monomer | Capping agent | Post baked at 120 C./60/air | Post baked at 175 C./60/N$_2$ | Post baked at 200 C./ N2/60 min |
|---|---|---|---|---|---|
| BMA 2-25 wt % TMPTA in BMA | 50-80 wt % | methoxy(triethyleneoxy) propyltrimethoxysilane and 3-methacryloyloxypropyl trimethoxysilane | good | cracked | |
| 25-30 wt % TMPTA in BMA | 50-80 wt % | methoxy(triethyleneoxy) propyltrimethoxysilane and 3-methacryloyloxypropyl trimethoxysilane | good | good | cracked |
| 20-30 wt % TMPTA in BMA | 50-80 wt % | 2-[2-(2-9-methoxyethoxy) ethoxy]acetic acid | good | good | good |
| 25-30 wt % TMPTA in BMA | 50-80 wt % | methoxy(triethyleneoxy) propyltrimethoxysilane | good | cracked | cracked |
| 25-30 wt % TMPTA in BMA | 82-86 wt % | 2-[2-(2-9-methoxyethoxy) ethoxy]acetic acid | good | cracked | cracked |

The photo-initiator may comprise or contain benzophenone, optionally in an amount of 1-5 wt % based on the total weight of the formulation or composition or material of the present disclosure. Such a photo-initiator may be mixed or included or dissolved or dispersed in the monomer and/or oligomer and/or polymer mix of the presently disclosed formulation by means known in the art, such as by stirring or vortexing at temperature of, for example, in the range of 20-30 C.

While benzophenone has been exemplified herein as a photo initiator, other photo initiators can also or otherwise be employed depending on, for example, curing time and lamp type. Other photo initiators of the present disclosure include Speedcure BEM and TPO (diphenyl(2,4,6-trimethylbenzoyl)-phosphine oxide), which may allow for considerable reduction in the required UV exposure time.

A nanocomposite or formulation of the present disclosure optionally has a viscosity of less than 12,000 Cps at 20° C. as measured by a Brookfield RVDV-II+PCP cone and plate viscometer. A nanocomposite or formulation of the present disclosure additionally or alternatively has a transmittance higher than 60% at a wavelength of 400 nm as measured by a Perkin Elmer Lambda 850 Spectrophotometer in a 1 cm path length cuvette. A nanocomposite and composition of the present disclosure contains or comprises an organic mixture of benzyl methacrylate and trimethylolpropane triacrylate. Such a nanocomposite, composition of the present disclosure optionally contains or comprises a weight ratio of benzyl methacrylate to TMPTA in the range of 75:25 to 65:35.

A nanocomposite or formulation or film of the present disclosure optionally and/or additionally possesses a refractive index of greater than 1.8 at 400 nm.

In some embodiments the nanocomposite or formulation of the present disclosure does not include the purposeful addition of solvents.

The polymer matrix may comprise acrylic, epoxy, silicone, siloxane, polycarbonate, polyurethane, polyimides, Poly(3,4-ethylenedioxythiophene) (PEDOT), poly(styrene sulfonate) (PSS) doped PEDOT, Polyethylene terephthalate (PET), Polyethylene naphthalate (PEN), or doped poly(4,4-dioctylcyclopentadithiophene), and their corresponding monomers and/or oligomers.

Another example of a method of forming a nanocomposite of the present disclosure includes mixing an epoxy resin, such as resin EPON 862, and curing agent W (or curing agent 3295, or the like), such as by hand using a weight ratio of 5:1. To this mixture ZnO or ZrO2 capped with methoxytri (ethyleneoxy)propyltrimethoxysilane is then added. The weight ratio of the nanocrystals to the epoxy mixture can be in the range of from 1:1000 to 10:1. A small amount of THF (no more than 200 wt % of the composite mixture) can be added to reduce the viscosity of the nanocrystal/epoxy resin mixture. The mixture is then sonicated either inside a sonication bath or using a Hielscher UP200S sonication probe for less than five minutes. After sonication, the composite mixture (2 gram to 4 grams) was then poured into an aluminum pan (4 cm diameter), which acted as a mold. The loaded pan was and placed inside a vacuum oven. Vacuum was applied in order to remove the THF and air bubbles. The oven was then heated to 80° C. for overnight (>10 hr) under vacuum. The resulting composite was post cured at 150° C. for another 3 hours before it was removed from the vacuum oven.

Another example of a method of forming a nanocomposite of the present disclosure may be as follows: epoxy resin EPON 862 and curing agent 3274 were pre-mixed by hand using weight ratio of 10:4. 3-(methacryloyloxy) propyl trimethoxysilane capped ZrO2 nanocrystals are then added into the epoxy resin at loading levels between 0.01-99.99 wt %. A small amount of acetone (no more than 200 wt % of the composite mixture) was added to reduce the viscosity of the nanocrystal/epoxy resin mixture. The mixture is then sonicated either inside a sonication bath or using a Hielscher UP200S sonication probe for less than five minutes. The mixed composite mixture (2 gram to 4 grams) was then poured into an aluminum pan (4 cm diameter), which acted as a mold. The loaded pan was then placed inside a vacuum oven. Vacuum was applied to remove the acetone and air bubbles. The resulting composite was cured at room temperature for 24 hours before it was removed from the vacuum oven.

For spin coating 3-(methacryloyloxy)propyl trimethoxysilane capped nanoparticle/epoxy composite films, a typical protocol is described as follows: epoxy resin EPON 862 and curing agent 3274 were premixed by hand using weight ratio of 10:4. The desired amount of capped nanocryastals is then added into the epoxy resin at loading levels between 1-99.99 wt %. Acetone was added to prepare a spin solution with an appropriate solid content (ranging from 10 wt % to 50 wt %). The mixture is then sonicated inside a sonication bath for 5 minutes. The solution can then be used directly for spin-coating. By varying the spin-rate different film thicknesses ranging from several hundred nanometers to several micrometers may be achieved.

Each lens or set of lenses of the exemplary light extraction structure may cover a single pixel of the light emitting device.

Each lens or set of lenses of the exemplary light extraction structure may cover multiple pixels of the light emitting device.

Each lens or set of lenses of the exemplary light extraction structure may comprise a single lens element, said lens element may comprise spherical, semi-spherical, hyper-semispherical, parabolic, concave, convex, sub-wavelength pyramid array, surface texture, or any other surface curvature, or Fresnel lens.

Each lens or set of lenses of the exemplary light extraction structure may comprise a single lens element, said lens element comprises a graded or gradient index profile along at least one dimension of the lens, said graded or gradient lens may comprise curved surface.

Each lens or set of lenses of the exemplary light extraction structure may comprise multiple lens elements, said lens elements may comprise singlet lens, lens with graded or gradient index profile, achromatic lens doublet, prism, filter, polarizer, reflector, Fresnel lens, or any other common optical elements.

Each lens or set of lenses of the exemplary light extraction structure may be separated from the active region of said light emitting device by less than the wavelength of the highest energy photons emitted by said light emitting device.

Another exemplary method of making a of a light extraction structure for a light emitting device comprises: an active region, an array of lenses or set of lenses, said array of lenses or sets of lenses comprise a high refractive index material having refractive index higher than the substrate or the encapsulation layer, said lenses or sets of lenses are applied between the active region of a light emitting device and the encapsulation layer of said light emitting device, a planarization layer between said array of lenses or sets of lenses and said encapsulation or substrate layer, said light extraction structure enhances the overall extraction efficiency of light generated by the active region to the viewer or the external light detector.

The applying in the exemplary method of making a light extraction structure comprises applying a prefabricated sheet comprising the said array of lenses or sets of lenses on top of the active region of said light emitting devices.

The applying a prefabricated sheet may comprise roll-to-roll printing.

The applying in the exemplary method of making a light extraction structure comprises applying a layer of the high refractive index materials on top the active regions, by spin-coating, dip-coating, blade coating, draw-bar coating, slot-die coting, spraying, or any other common coating techniques, and then forming said array of lenses or set of lenses through imprint lithography, optical lithography, or another other common patterning techniques.

The apply in the exemplary method of making a light extraction structure comprises UV curing.

The apply in the exemplary method of making a light extraction structure comprises thermal curing.

EXAMPLES

Figure 3:
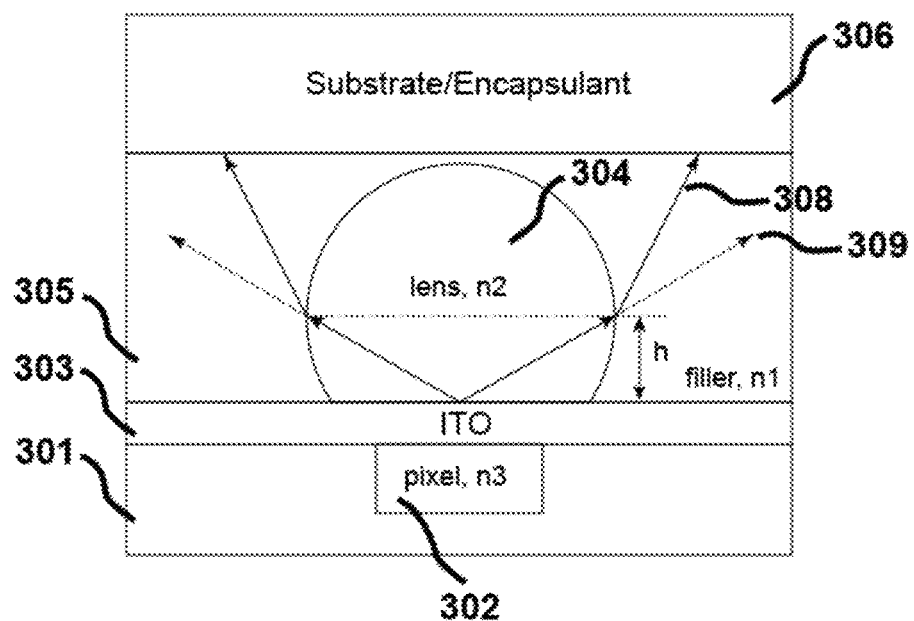
FIG. 3 shows an exemplary OLED pixel of presently disclosed technology using a hyper-hemispherical lens.
Figure 4A:
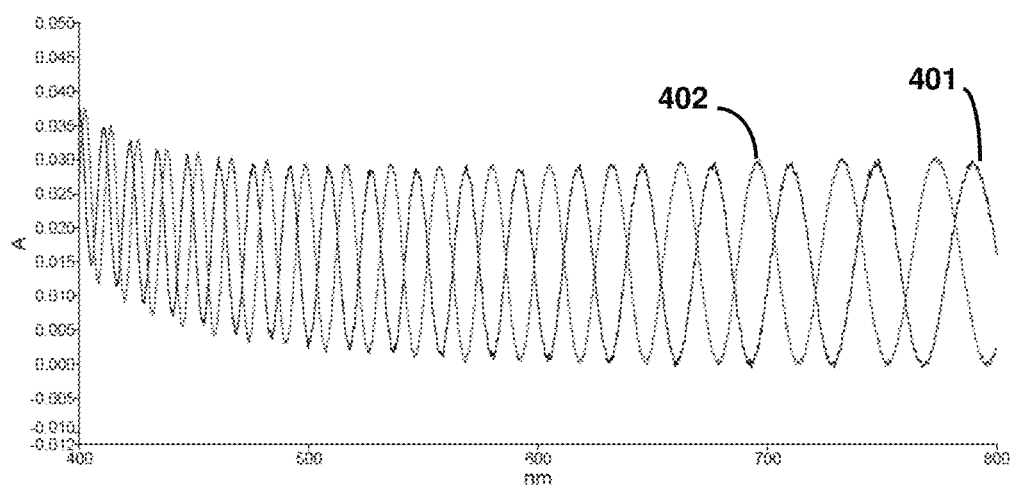
FIG. 4a: UV absorption spectrum of film from formulation ($ZrO_2$-(2-[2-(2-9-methoxyethoxy) ethoxy]acetic acid) in 70:30 BMA-TMPTA) after post bake at (401) 120° C. for 3 minute in air, (402) thermal bake at 175° C. for 1 hour under $N_2$.
Figure 4B:
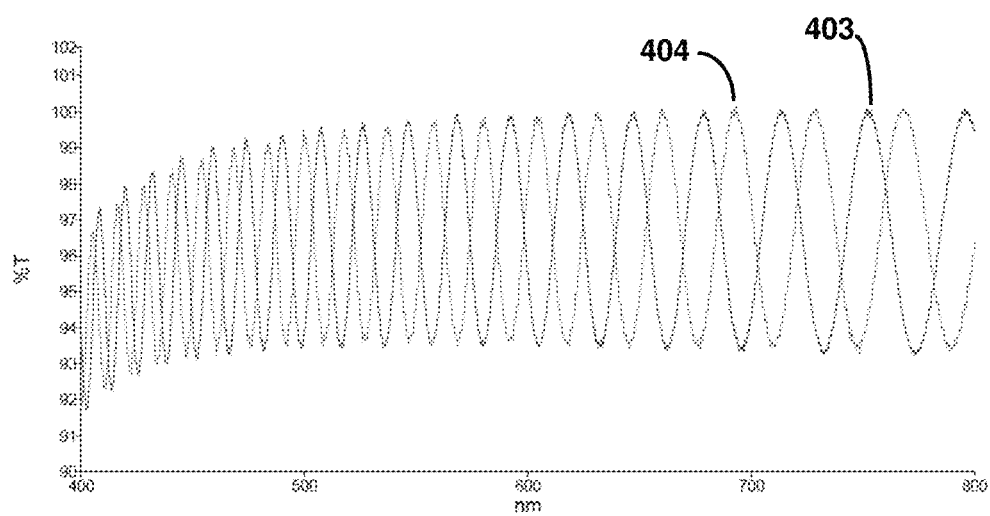
FIG. 4b: UV transmission spectrum of film from formulation ($ZrO_2$-(2-[2-(2-9-methoxyethoxy) ethoxy]acetic acid) in 70:30 BMA-TMPTA) after post bake at (403) 120° C. for 3 minute in air, (404) thermal bake at 175° C. for 1 hour under $N_2$.
Figure 5A:
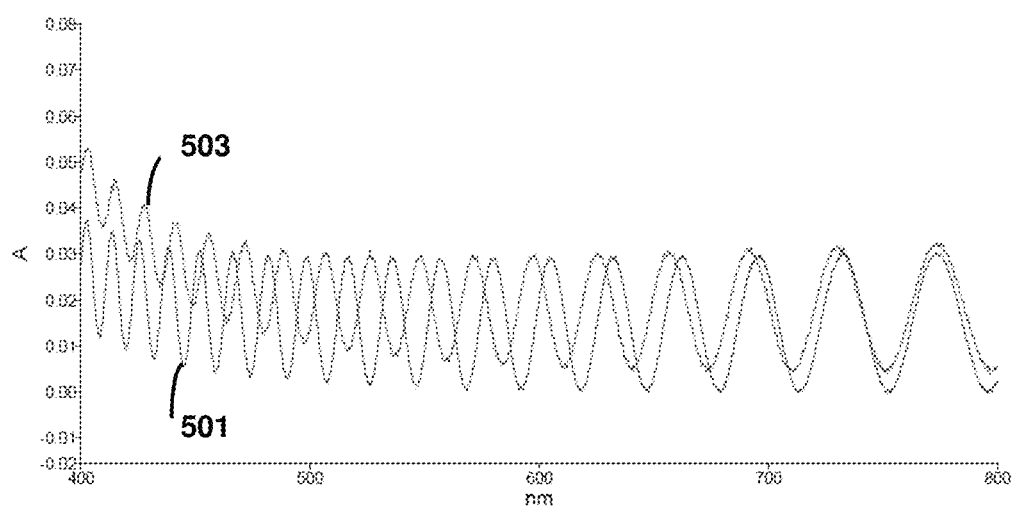
FIG. 5a: UV absorption spectrum of film from formulation ($ZrO_2$-(2-[2-(2-9-methoxyethoxy) ethoxy]acetic acid) in 70:30 BMA-TMPTA) after post bake at (501) 120° C. for 3 minute in air, (503) thermal bake at 200° C. for 1 hour under $N_2$.
Figure 5B:
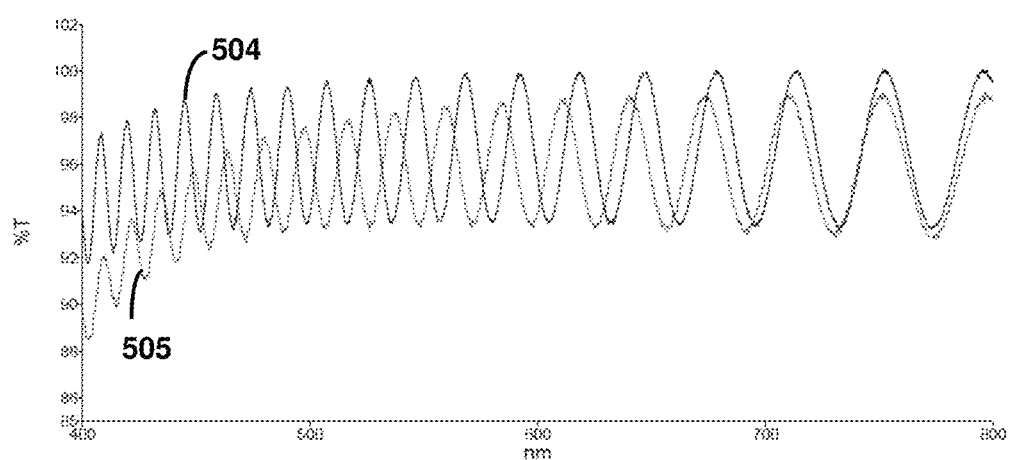
FIG. 5b: UV transmission spectrum of film from formulation ($ZrO_2$-(2-[2-(2-9-methoxyethoxy) ethoxy]acetic acid) in 70:30 BMA-TMPTA) after post bake at (504) 120° C. for 3 minute in air, (505) thermal bake at 200° C. for 1 hour under $N_2$.
Figure 6A:
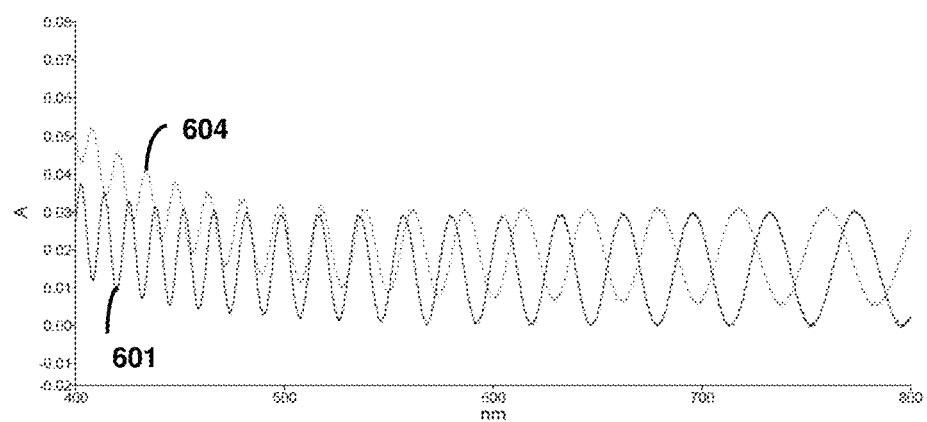
FIG. 6a: UV absorption spectrum of film from formulation ($ZrO_2$-(2-[2-(2-9-methoxyethoxy) ethoxy]acetic acid) in 70:30 BMA-TMPTA) after post bake at (601) 120° C. for 3 minute in air, (604) thermal bake at 200° C. for 2 hour under $N_2$.
Figure 6B:
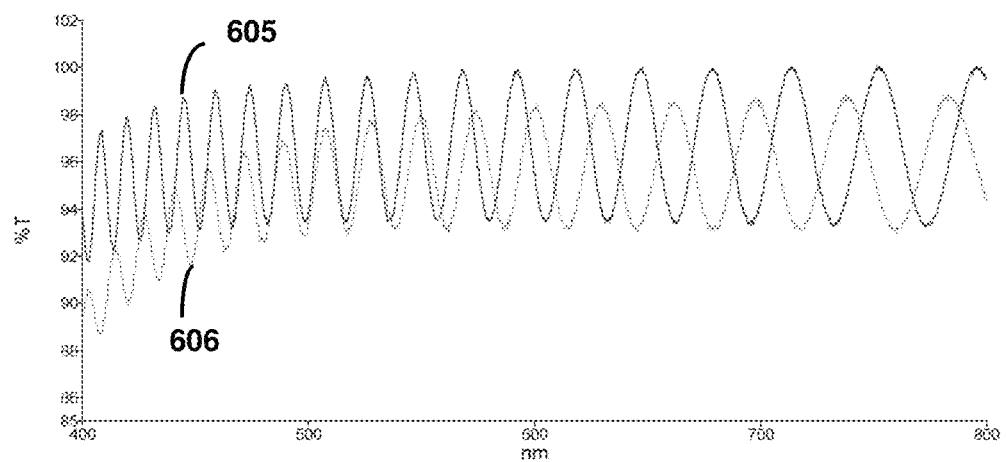
FIG. 6b: UV transmission spectrum of film from formulation ($ZrO_2$-(2-[2-(2-9-methoxyethoxy) ethoxy]acetic acid) in 70:30 BMA-TMPTA) after post bake at (605) 120° C. for 3 minute in air, (606) thermal bake at 200° C. for 2 hour under $N_2$.

One example light extraction structure comprises an array of hyper hemispherical, lens centered on an active region. For illustration purpose, one unit of such a structure is shown in FIG. 3. The structure is similar to FIG. 2, the active region (301) is divided into pixels (302). For simplicity, only one pixel is shown here. The pixel or pixels having a refractive index of n3. An ITO layer (303) may exist between the pixel and the lens. The lens is shaped into a hyper-semi-sphere (304) with h=R/n2, where R is the radius of the semi-sphere and n2 is the refractive index of the lens, also known as Weierstrauss geometry. A filler, or a planarization layer (305), with refractive index n1, may be applied between the lens and the substrate (306).

In the case n3>n2>n1, it can be shown with simple ray tracing, that for both hyper semispherical and spherical, which is a special case with h=0, lenses can significantly improve the light extraction from the pixels. And the geometry with h=R/n2 offers the highest collection efficiency. The hyper semispherical lens offers an extra benefit in that for an emitter located at the center of the lens, it focuses the emitted light to a smaller solid angle, as shown in FIG. 3. 309 represents the rays without any lens or with a spherical lens, while 308 represents the rays after the hyper semispherical lens. For an optical system with a limited numerical aperture, in this case the numerical aperture is limited by the total internal reflection at the substrate/air, this ability makes hyper semispherical lens efficient in coupling into the substrate/air interface escape cone.

Figure 1:
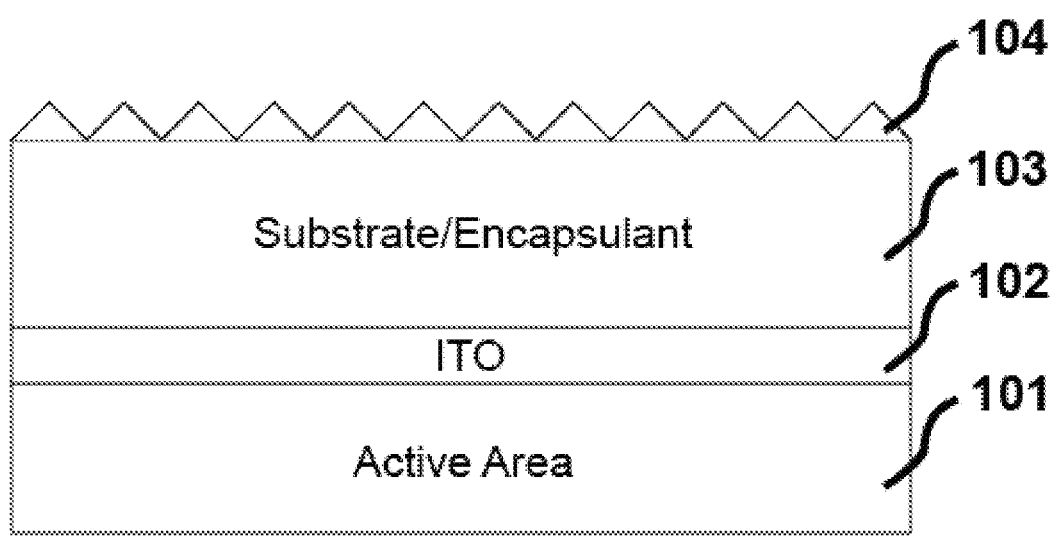
FIG. 1 shows an exemplary OLED device structure with textured surface.

Another example light extraction structure comprises an array of hemispherical lens centered on an active region, in a similar structure as in FIG. 2, with 204 being hemispherical lenses. Such a system provides higher light coupling compared with the system in FIG. 1 without surface texturing (104).

Another example light extraction structure comprises an array of hypo-spherical lens centered on an active region, in a similar structure as in FIG. 2, with 204 being hypo-spherical lenses. In hypo-spherical lens, h is negative. Such a system still provides higher light coupling compared with the system in FIG. 1 without surface texturing (104).

In one example of an exemplary non-limiting formulation, acrylic monomers, benzyl methacrylate (BMA) and trimethylolpropane triacrylate (TMPTA), was mixed in a mass ratio of 70-75 to 25-30. 1-5 wt % of benzophenone as photo initiator, was dissolved in the monomer mix either by stirring or vortexing at temperature of 20-30 C. The solution was then filtered to remove dusts and then added to dry $ZrO_2$ nanocrystal and allowed to soak in the monomer blend until no $ZrO_2$ powder was observed. In large scale, gently shaking the dried nanocrystals with the monomer blend is acceptable. Once all $ZrO_2$ nanocrystals powder was completely dispersed in BMA-TMPTA, the viscous suspension was mixed for 10-15 hours. Finally, the viscous suspension was filtered before processing the film.

The suspension was validated by coating films and characterizing the physical properties of the films such as thermal stability and transmittance.

As a standard method, the suspension was coated on a 2" silicon wafer or fused silica wafer to inspect its quality. The wafers were cleaned before applying the film to remove contaminants and dusts. 3-4 micron thick film was spin coated on silicon wafer at 1000-4000 rpm for 1-5 minute.

An optional pre-bake process at 90° C. may be performed to remove the residual solvent if that is a concern. In these formulations the solvent is typically less than 10 wt %, more preferably less than 1 wt %. The film was inspected for defects from undispersed particles or air bubbles. If no defects were observed, its surface roughness is measured using a surface profilometer.

The film coated on glass slide or fused silica wafer was cured by UV exposure for 60-200 seconds using a Dymax EC-5000 system with a mercury 'H' bulb and then post-baked for 2-5 minutes at 120-150° C. under air. Further, the thermal stability of the film was tested by heating the film at a temperature of 175° C. or above, optionally about 200° C., under nitrogen atmosphere for 1-2 hours. A crack free, colorless film is desirable and indicates a good formulation.

These film demonstrate a refractive index of 1.80 or greater at 400 nm and transmittance>89% at 400 nm.

The refractive index is measured with a Woollam M-2000 spectroscopic ellipsometer in the spectral range from 350 nm to 1700 nm and the transmittance was measured using a Perkin Elmer Lambda 850 Spectrophotometer.

This example formulation with 65-75:25-35 mass ratio of BMA to TMPTA with nanocrystal loading of 50 wt % and above produced films that are UV curable and can withstand a thermal baking at 200 C for 1-2 hour under nitrogen, as shown in Table 1.

Films spin coated from formulation containing zirconium oxide nanocrystals capped with 2-[2-(2-9-methoxyethoxy) ethoxy]acetic acid at 50-80 wt % loading in the BMA-TMPTA (65-75:25-35 mass ratio) were stable and did not crack when heated at temperatures up to 200° C. However, films from formulation containing zirconium oxide nanocrystals capped with 2-[2-(2-9-methoxyethoxy) ethoxy]acetic acid at 82-85 wt % loading in the BMA-TMPTA (65-75:25-35 mass ratio) were stable only at temperatures below 120° C., as shown in Table 1. Also, zirconium oxide nanocrystals modified with other capping agents such as methoxy (triethyleneoxy) propyltrimethoxysilane and/or 3-methacryloyloxypropyltrimethoxysilane and/or n-octyl trimethoxysilane and/or dodecyltrimethoxysilane and/or m,p-ethylphenethyl trimethoxysilane formed good dispersions in BMA-TMPTA mixture, as well as good films, but was only stable up to 120° C.

One advantage of this exemplary non-limiting embodiment is that both monomers are in liquid form at room temperature so no solvent is necessary at room temperature and the film is UV curable. Surface modified $ZrO_2$ nanocrystals are dispersed directly in the monomer. Such a direct dispersion eliminates, for example, the need to remove the solvent at a later step.

Nanocrystals of the exemplified embodiments of the present disclosure have been surface modified with various capping agents such as 2-[2-(2-9-methoxyethoxy) ethoxy] acetic acid and/or methoxy(triethyleneoxy) propyltrimethoxysilane and/or 3-methacryloyloxypropyltrimethoxysilane and or n-octyl trimethoxysilane and/or dodecyltrimethoxysilane and/or m,p-ethylphenethyl trimethoxysilane. In an exemplified method of producing the capped nanocrystals of the present disclosure, the as-synthesized nanocrystals are allowed to settle for at least 12 hours after synthesis. Since the nanocrystals are surface modified in a solvent other than the synthesis solvent, the nanocrystals are separated from the reaction liquid by decanting off the reaction liquid and rinsing the nanocrystals with the capping solvent. The rinsing solvent is decanted off to obtain a wet cake of uncapped nanocrystals.

For the surface modification of the nanocrystals with 2-[2-(2-9-methoxyethoxy) ethoxy]acetic acid, the nanocrystals are suspended in the capping solvent, for example, toluene for 2-[2-(2-9-methoxyethoxy) ethoxy]acetic acid modification, at a loading of 10 wt % or greater, or 20 wt % or greater, or 30 wt % or greater, calculated based on the weight of the wet nanocrystal cake. While the suspension is stirred, the capping agent is added to it slowly. The amount of capping agent used is in the presently exemplified embodiment 8-60 wt % to the weight of the wet nanocrystal cake. The suspension is allowed to stir at 20-27° C. for 10-30 minutes and then refluxed at the boiling point of the capping solvent for 30-60 minutes. After refluxing, the clear solution is cooled to 50-60° C. slowly. This suspension is then filtered to remove dusts and aggregates bigger than 200 nm sizes.

The capped nanocrystals are then precipitated out from the capping solvent using heptane (2-4 times the mass of the capped solution). The precipitated nanocrystals are collected by centrifugation. The nanocrystal thus collected is dispersed in tetrahydrofuran (THF) and again re-precipitated using heptane. This process is repeated twice. The wet cake of nanocrystals collected in the final step is dried under vacuum for at least 12 hours.

We claim:

1. A light emitting diode (LED) display comprising, in order:
    a planarization layer,
    an array of lenses, and
    an array of light emitting pixels, wherein
    the array of lenses comprise a nanocomposite having a refractive index in the range of greater than 1.7 to 1.9 at 400 nm, the nanocomposite comprising inorganic nanocrystals and a polymeric matrix, wherein the refractive index of the nanocrystals is greater than the refractive index of the polymeric matrix; and wherein
    the planarization layer has a refractive index that is less than the refractive index of the nanocomposite.

2. The LED display of claim 1, further comprising an encapsulation or a substrate layer in contact with the planarization layer on a surface of the planarization layer opposite a surface facing the array of light emitting pixels.

3. The LED display of claim 1, wherein the nanocomposite is UV curable.

4. The LED display of claim 1, wherein the nanocomposite is thermally curable.

5. The LED display of claim 1, wherein the nanocomposite comprises $ZrO_2$, $TiO_2$, ZnO, MgO, $HfO_2$, $Nb_2O_5$, $Ta_2O_5$, or $Y_2O_3$ nanocrystals.

6. The LED display of claim 5, wherein the nanocrystals have a size of less than 10 nm in at least one dimension.

7. The LED display of claim 5, wherein the nanocomposite comprises a polymer, and wherein the polymer optionally comprises an acrylic, an epoxy or a silicone.

8. The LED display of claim 7, wherein the polymer comprises a siloxane, a polycarbonate, a polyurethane, a polyimide, poly(3,4-ethylenedioxythiophene) (PEDOT), poly(styrene sulfonate) (PSS), polyethylene terephthalate (PET), polyethylene naphthalate (PEN), or poly(4,4-dioctylcyclopentadithiophene).

9. The LED display of claim 1, wherein at least one of the lenses covers a single pixel.

10. The LED display of claim 1, wherein at least one of the lenses covers multiple pixels.

11. The LED display of claim 1, wherein a lens of the array of lenses comprises a spherical surface, a semi-spherical surface, a hyper-hemispherical surface or a parabolic surface.

12. The LED display of claim 1, wherein a lens of the array of lenses comprises a concave surface, a convex surface, a sub-wavelength pyramid array surface or a textured surface.

13. The LED display of claim 1, wherein a lens of the array of lenses comprises a graded or gradient index profile along at least one dimension of the lens.

14. The LED display of claim 1, wherein the array of lenses is separated from the array of light emitting pixels by a distance of less than the wavelength of the highest energy photons emitted by the array of pixels.

15. The LED display of claim 1, wherein the nanocrystals are at least partially capped.

16. A light emitting diode (LED) display comprising, in order:
an array of lenses, and
an array of light emitting pixels, wherein
the array of lenses comprises a nanocomposite, wherein the nanocomposite comprises inorganic nanocrystals and a polymeric matrix, the nanocomposite having a refractive index between 1.6 and 1.9 at 400 nm, wherein the refractive index of the nanocrystals is greater than the refractive index of the polymeric matrix; and wherein
the array of lenses is not in contact with a planarization layer and/or a substrate layer spaced further away from the pixel than the array of lenses.

17. The LED display of claim 16, wherein the nanocomposite is UV curable.

18. The LED display of claim 16, wherein the nanocomposite is thermally curable.

19. The LED display of claim 16, wherein the nanocomposite comprises $ZrO_2$, $TiO_2$, ZnO, MgO, $HfO_2$, $Nb_2O_5$, $Ta_2O_5$, or $Y_2O_3$ nanocrystals.

20. The LED display of claim 19, wherein the nanocrystals have a size of less than 10 nm in at least one dimension.

21. The LED display of claim 16, wherein the nanocomposite comprises a polymer, and wherein the polymer optionally comprises an acrylic, an epoxy or a silicone.

22. The LED display of claim 21, wherein the polymer comprises a siloxane, a polycarbonate, a polyurethane, a polyimide, poly(3,4-ethylenedioxythiophene) (PEDOT), poly(styrene sulfonate) (PSS), polyethylene terephthalate (PET), polyethylene naphthalate (PEN), or poly(4,4-dioctylcyclopentadithiophene).

23. The LED display of claim 16, wherein at least one of the lenses covers a single pixel.

24. The LED display of claim 16, wherein at least one of the lenses covers multiple pixels.

25. The LED display of claim 16, wherein a lens of the array of lenses comprises a spherical surface, a semi-spherical surface, a hyper-hemispherical surface, or a parabolic surface.

26. The LED display of claim 16, wherein a lens of the array of lenses comprises a concave surface, a convex surface, a sub-wavelength pyramid array surface, or a textured surface.

27. The LED display of claim 16, wherein a lens of the array of lenses comprises a graded or gradient index profile along at least one dimension of the lens.

28. The LED display of claim 16, wherein the array of lenses is separated from the array of light emitting pixels by a distance of less than the wavelength of the highest energy photons emitted by the array of pixels.

29. The LED display of claim 16, wherein the nanocrystals are at least partially capped.

30. A method of making a light emitting diode (LED) display comprising:
(a) forming an array of light-emitting pixels;
(b) providing a planarization layer; and
(c) forming an array of lenses between the light-emitting pixels and the planarization layer, wherein
the array of lenses comprise a nanocomposite having a refractive index in the range of greater than 1.7 to 1.9 at 400 nm, the nanocomposite comprising inorganic nanocrystals and a polymeric matrix, wherein the refractive index of the nanocrystals is greater than the refractive index of the polymeric matrix; and wherein
the planarization layer has a refractive index that is less than the refractive index of the nanocomposite.

31. The method of claim 30, further comprising forming an encapsulation or substrate layer so as to be in contact with the planarization layer on a surface of the planarization layer opposite a surface facing the array of light emitting pixels.

32. The method of claim 30, wherein the nanocomposite is UV curable.

33. The method of claim 30, wherein the nanocomposite is thermally curable.

34. The method of claim 30, wherein the nanocrystals have a size of less than 10 nm in at least one dimension.

35. The method of claim 30, wherein the polymeric matrix comprises an acrylic polymer, an epoxy polymer or a silicone polymer.

36. The method of claim 30, wherein the polymeric matrix comprises a siloxane, a polycarbonate, a polyurethane, a polyimide, poly(3,4-ethylenedioxythiophene) (PEDOT), poly(styrene sulfonate) (PSS), polyethylene terephthalate (PET), polyethylene naphthalate (PEN), or poly(4,4-dioctylcyclopentadithiophene).

37. The method of claim 30, wherein at least one of the lenses covers a single pixel.

38. The method of claim 30, wherein at least one of the lenses covers multiple pixels.

39. The method of claim 30, wherein at least one lens of the array of lenses comprises a spherical surface, a semi-spherical surface, a hyper-hemispherical surface or a parabolic surface.

40. The method of claim 30, wherein at least one lens of the array of lenses comprises a concave surface, a convex surface, a sub-wavelength pyramid array surface or a textured surface.

41. The method of claim 30, wherein at least one lens of the array of lenses comprises a graded or gradient index profile along at least one dimension of the lens.

42. The method of claim 30, wherein the array of lenses is separated from the array of light emitting pixels by a distance of less than the wavelength of the highest energy photons emitted by the array of pixels.

43. The method of claim 30, further comprising forming the planarization layer so as to cover the array of lenses.

44. The method of claim 30, which comprises applying a prefabricated sheet comprising the array of lenses on top of the array of light-emitting pixels.

45. The method of claim 44, wherein the applying is practiced by roll-to-roll printing.

46. The method of claim 30, wherein step (c) is practiced by applying a layer of the nanocomposite over the array of pixels by spin-coating, dip-coating, blade coating, draw-bar coating, slot-die coating or spraying, and thereafter forming the array of lenses by patterning the applied layer of material.

47. The method of claim 46, wherein the patterning of the applied layer is practiced by imprint lithography, optical lithography.

48. The method of claim 46, wherein the array of lenses is formed by UV curing the nanocomposite.

49. The method of claim 46, wherein the array of lenses is formed by thermally curing the nanocomposite.

\* \* \* \* \*